US006297352B1

(12) United States Patent
Wanat et al.

(10) Patent No.: US 6,297,352 B1
(45) Date of Patent: Oct. 2, 2001

(54) METHOD OF REDUCING METAL ION CONTENT OF FILM-FORMING RESINS USING A LIQUID/LIQUID CENTRIFUGE

(75) Inventors: Stanley F. Wanat, Scotch Plains; M. Dalil Rahman, Flemington, both of NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/597,440

(22) Filed: Jun. 20, 2000

Related U.S. Application Data

(63) Continuation-in-part of application No. 09/418,239, filed on Oct. 14, 1999, now Pat. No. 6,121,412, which is a continuation-in-part of application No. 09/190,763, filed on Nov. 12, 1998, now abandoned.

(51) Int. Cl.⁷ ............................... C08F 6/04; C08F 6/12; C08G 14/04
(52) U.S. Cl. .................. 528/502 D; 528/503; 430/270.1; 430/313
(58) Field of Search ............................... 528/502 D, 503; 430/270.1, 313

(56) References Cited

U.S. PATENT DOCUMENTS

| 5,371,169 | * | 12/1994 | Lee et al. ............................... 525/480 |
| 5,374,693 | * | 12/1994 | Lynch et al. ............................ 525/501 |
| 5,521,052 | * | 5/1996 | Rahman et al. ..................... 430/270.1 |
| 5,646,218 | * | 7/1997 | Lynch et al. ............................ 525/501 |
| 5,665,517 | * | 9/1997 | Rahman et al. ..................... 430/270.1 |
| 5,693,749 | * | 12/1997 | Rahman et al. ....................... 528/482 |
| 5,739,265 | * | 4/1998 | Rahman et al. ....................... 528/482 |
| 5,750,632 | * | 5/1998 | Rahman et al. ....................... 528/129 |
| 6,121,412 | * | 9/2000 | Wanat et al. ....................... 528/502 D |

* cited by examiner

Primary Examiner—Duc Truong
(74) Attorney, Agent, or Firm—Krishna G. Banerjee

(57) ABSTRACT

The present invention provides a method for reducing the metal ion content of a film-forming resin, said method comprising the steps of: a) providing a solution of the film-forming resin in a water-immiscible solvent system comprising at least one water-immiscible solvent; b) providing a washing solution comprising water or a dilute solution of a water-soluble metal ion chelating agent; c) feeding the solutions from a) and b) through two separate inlet ports into a liquid/liquid centrifuge, one of said inlet ports feeding solution from a), the second inlet port feeding the solution from b) into said liquid/liquid centrifuge at a feed rate ratio of the solution from a) to that from b) from about 10/90 to about 90/10, at a temperature of from about 0° C. up to a maximum temperature that is less than the boiling point of the lowest boiling water-immiscible solvent in the water-immiscible solvent system; and d) rotating the mixture from step c) inside said liquid/liquid centrifuge at a rotational speed sufficient to separate the mixture from step c) into two separate phases, and then collecting the two separate phases, each through a separate outlet port, into two separate containers, wherein the heavier phase (H) comprises the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system, and 3) the film-forming resin. The present invention also provides for a method for producing a photoresist composition and a method for producing a microelectronic device utilizing a film-forming resin produced by the aforementioned method.

12 Claims, No Drawings

METHOD OF REDUCING METAL ION CONTENT OF FILM-FORMING RESINS USING A LIQUID/LIQUID CENTRIFUGE

This application is a CIP of Ser. No. 09/418,239 filed Oct. 14, 1999 now U.S. Pat. No. 6,121,418, which is a CIP of Ser. No. 09/190,763 filed Nov. 12, 1998 now abandoned.

BACKGROUND OF THE INVENTION

The present invention provides a process for reducing the metal ion content of a film-forming resin with good lithographic performance in light sensitive photoresist compositions, and for using such a film-forming resin in such light-sensitive compositions. The present invention also provides a process for preparing these film-forming resins by continuous. liquid/liquid extraction utilizing a liquid/liquid centrifuge and using such resins for making a high quality light-sensitive photoresist composition (including both positive and negative working photoresist compositions). Further, the present invention provides a process for coating a substrate with these light-sensitive compositions, as well as a process for forming an image and developing these light-sensitive mixtures on such a substrate.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked-coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed (in the case of positive photoresist) or the unexposed (in the case of negative photoresist) areas of the coated surface of the substrate.

Novolak resins are frequently used as the polymeric binder in positive liquid photoresist formulations. These resins are typically produced by running a condensation reaction between formaldehyde and one or more multi-substituted phenols, in the presence of an acid catalyst, such as oxalic acid, maleic acid, or maleic anhydride. In producing sophisticated semiconductor devices, it has become increasingly important to provide a film forming novolak resin of superior quality in terms of dissolution rate, better binding properties with a diazonaphthoquinone, and heat resistance. It is further imperative that these materials contain low metal contaminants since these impurities can adversely affect electrical circuitry in advanced microlithographic electronic devices. Metal levels of <50 ppb or lower are commonly required for commercial resists sold on the market today. Although negative resist compositions are made from film-forming resins different from novolak resins, the same quality issues and requirement for low metal resins still apply.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron is quite common. In addition, it is almost always desirable that the developed photoresist wall profiles be near vertical relative to the substrate. Such demarcations between developed and undeveloped areas of the resist coating translate into accurate pattern transfer of the mask image onto the substrate.

In recent years there has been significant progress in novolak resin synthesis and methods of removing metal impurities. In a typical novolak reaction, a reactor is charged with phenolic compounds, an acid catalyst such as oxalic acid, maleic acid, p-toluene sulphonic acid or any mineral acid, and is heated to 95 to 100° C. Formaldehyde is slowly added and the mixture is heated at reflux for 6 hours. At the end of the condensation period, the reactor is converted to distillation, and the temperature is raised to 200° C. At this point vacuum is slowly drawn, the temperature is raised to 220° C., and the pressure is reduced to below 20 mm Hg. After the volatiles have been distilled off, the vacuum is released and the molten resin collected and allowed to cool. In spite of using fairly pure starting materials and preventing contamination during synthesis, resin products often contain higher metal ion impurities than allowed for sale. Various metal ion removal processes have been described and are included herein for reference. In U.S. Pat. No. 5,378,802, K. Honda describes a method where a resist component in a solvent is treated with fibrous ion exchange resins that are subsequently removed by filtration. Szmanda and Carey teach a method of removing anions from organic solution by using a modified anion exchange resin having source anions less basic than hydroxyl anions. In a series of patents, U.S. Pat. No. 5,521,052, U.S. Pat. No. 5,543,263, U.S. Pat. No. 5,565,496, U.S. Pat. No. 5,594,098, U.S. Pat. No. 5,686,561, U.S. Pat. No. 5,858,627 and U.S. Pat. No. 5,955,570, Rahman et. al. describes metal ion reduction techniques utilizing sequential treatment with cationicm and anionic resins and the means of preparing these ion exchange media. This series of patents also teaches the advantages of utilizing ion exchange processes in polar solvents and the use of a specially constructed container filled with activated ion exchange resin. In addition, water washing with low conductivity de-ionized water has also been used to remove metals.

All of the aforementioned metal removal methods are time consuming and are essentially batch processes. Furthermore, introduction of acids or bases from the ion exchange media can affect photospeeds of the resists using resins prepared in this way. In some instances, changes in the resin (such as changes in molecular weight due to fractionation) are observed as a result of the carryover of small amounts of solubilized low molecular weight components of the resin into the aqueous phase of the ion-exchange media. The present invention overcomes these difficulties. The present invention also lends itself to a semicontinuous/continuous process and reduces the time needed to make low metals ion resins for photoresists. By using a semicontinuous or continuous liquid/liquid centrifuge where a resin solution can be introduced through one inlet port of the centrifuge while water or an aqueous solution of a metal ion chelating material is introduced through a second port, an efficient method of reducing metals ions in film-forming resins is achieved.

SUMMARY OF THE INVENTION

The present invention provides a method for reducing the metal ion content of a film-forming resin, said method comprising the steps of:

a) providing a solution of the film-forming resin in a water-immiscible solvent system comprising at least one water-immiscible solvent;

b) providing a washing solution comprising water or a dilute solution of a water-soluble metal ion chelating agent;

c) feeding the solutions from a) and b) through two separate inlet ports into a liquid/liquid centrifuge, one of said inlet ports feeding solution from a), the second inlet port feeding the solution from b) into said liquid/liquid centrifuge at a feed rate ratio of the solution from a) to that from b) from 10/90 to 90/10, at a temperature of from 0° C. up to a maximum temperature that is less than the boiling point of the lowest boiling water-immiscible solvent in the water-immiscible solvent system;

d) rotating the mixture from step c) inside said liquid/liquid centrifuge at a rotational speed sufficient to separate the mixture from step c) into two separate phases, and then collecting the two separate phases, each through a separate outlet port, into two separate containers, wherein the heavier phase (H) comprises the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system, and 3) the film-forming resin.

The present invention also provides a method for reducing the metal ion content of a film-forming resin, said method comprising; the steps of:

a) providing a solution of the film-forming resin in a water-immiscible solvent system comprising at least one water-immiscible solvent;

b) providing a washing solution comprising water or a dilute solution of a water-soluble metal ion chelating agent;

c) feeding the solution from a) and a portion of the solution from b) through two separate inlet ports into a liquid/liquid centrifuge, one of said inlet ports feeding the solution from a), the second inlet port feeding the portion of the solution from b) into said liquid/liquid centrifuge at a feed rate ratio of the solution from a) to that of b) from 10/90 to 90/10, at a temperature of from 0° C. up to a maximum temperature that is less than the boiling point of the lowest boiling water-immiscible solvent in the water-immiscible solvent system;

d) rotating the mixture from step c) inside said liquid/liquid centrifuge at a rotational speed sufficient to separate the mixture from step c) into two separate phases, and then collecting the two separate phases, each through a separate outlet port, into two separate containers, wherein the heavier phase (H) contains the film-forming resin having a reduced metal ion content in the water-immiscible solvent system, with a minor amount of water; and the lighter phase (L) comprises: 1) an aqueous solution of metal ions and a, minor amount of a mixture of 2) the water-immiscible solvent system and 3) the film-forming resin; and iteratively performing a cycle of steps e) and f) in the following order:

e) adding another portion of the solution from b) to the lighter phase (L) in step d) to form a new mixture of lighter phase (L), and feeding said new mixture of lighter phase (L) and the heavier phase (H) in step d) through the two separate inlet ports, one of said inlet ports feeding the heavier phase (H), the second inlet port feeding the new mixture of the lighter phase (L), into the liquid/liquid centrifuge at a feed rate ratio of the new mixture of lighter phase (L) to the heavier phase (H) from 10/90 to 90/10, at a temperature of from 0° C. up to a maximum temperature that is less than the boiling point of the lowest boiling water-immiscible solvent in the water-immiscible solvent system; and f) rotating the mixture from step d) inside said liquid/liquid centrifuge at a rotational speed sufficient to separate the mixture of step e) into two separate phases, and then collecting the two phases, each through a separate outlet port, into two separate containers, wherein the heavier phase (H) contains the film-forming resin having a reduced metal ion content in the, water-immiscible solvent system, with a minor amount of water; and the lighter phase (L) comprises: 1) an aqueous solution of metal ions and a minor amount of a mixture of 2) the water-immiscible solvent system and 3) the film-forming resin.

The present invention also provides method for producing a photoresist composition, said method comprising:
a) providing a film-forming resin having a reduced metal ion content according to the aforementioned method;
b) providing an admixture of: 1) a photosensitive component in an amount sufficient to photosensitive a photoresist composition; 2) the film-forming resin in a); and optionally, 3) an additional photoresist solvent; to form a photoresist composition.

The present invention also provides a method for producing a microelectronic device by forming an image on a substrate, said method comprising:
a) providing the aforementioned photoresist composition;
b) thereafter, coating a suitable substrate with the photoresist composition from step a);
c) thereafter, heat treating the coated substrate until substantially all of the water-immiscible solvent system is removed; image-wise exposing the coated substrate; and then removing the imagewise exposed areas, or alternatively the unexposed areas of the coated substrate with a suitable developer.

DESCRIPTION OF THE PREFERRED EMBODIMENTS a) Providing a Solution of Film-forming Resin One step of the present method for reducing the metal content of a film-forming resin involves providing a solution of the film-forming resin in a water-immiscible solvent system comprising at least one water-immiscible solvent system.

Preferably, the film-forming resin is a polymer is useful in making photoresists. Nonlimiting examples of suitable resins are novolak resins, vinylphenol polymers and derivatives thereof. Novolak resins have been commonly used in the art of photoresist manufacture as exemplified by "Chemistry and Application of Phenolic Resins", Knop A. and Scheib, W.; Springer Verlag, N.Y., 1979 in Chapter 4.

The water-immiscible solvent preferably comprises those solvents used in photoresist compositions. Suitable examples of water-immiscible solvents include without limitation propylene glycol methyl ether acetate, 3-methoxy-3-methyl butanol, 2-heptanone (methyl amyl ketone), ethylene glycol monomethyl ether, ethylene glycol monoethyl ether, diethylene glycol monoethyl ether, ethylene glycol monoethyl ether acetate, ethylene glycol monomethyl acetate, or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropiconate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, propyl 2-methoxy propionate, and mixtures thereof.

In one embodiment, the concentration of the film-forming resin in the water-immiscible solvent ranges from 10 to 50% by weight, more reeferably 15 to 45% by weight, and most preferably 20 to 40% by weight.

b) Providing the Washing Solution

Another step of the present method involves providing a washing solution comprising water or a dilute solution of a water-soluble metal ion chelating agent.

Preferably the water used is deionized water that does not have appreciable conductivity (typically 18 mega-ohm or less). Examples of suitable metal ion chelating agents include without limitation ethylene diamine tetra-acetic acid (EDTA), ammonium salt of ethylene diamine tetra-acetate and citric acid.

In one embodiment, the concentration of the solution of the metal ion chelating agent ranges from 0.05% to 0.5% by weight, more preferably from 0.1% to 0.4% by weight, and most preferably from 0.15% to 0.30% by weight. Higher concentrations of metal ion chelating agent can also be used, but residues of the chelating agent may affect the properties of the resist formulations made with the film-forming resin.

In one embodiment, the level of the active metal ion chelating agent with respect to the film-forming resin ranges from 0.01% to 5% by weight, more preferably from 0.15% to 3% by weight.

c) Feeding of Solutions from Steps a) and b) Into Centrifuge

Another step of the present method involves feeding the solution of the film-forming resin (i.e. solution from a)) and the washing solution (i.e., solution from b)) through two separate inlet ports into a liquid/liquid centrifuge, one of said inlet port feeding the solution from a), the second inlet port feeding the solution from b) into said liquid/liquid centrifuge at a feed rate ratio of the solution from a) to that from b) of 10/90 to 90/10, and in one embodiment 65/35 to 35/65, at a temperature of from 0° C. up to a maximum temperature that is less than the boiling point of the lowest boiling water-immiscible solvent in the water-immiscible solvent system. In one embodiment, the temperature ranges from 10° to 20° less than the boiling point of the lowest boiling water-immiscible solvent. In one embodiment, the actual temperature of feeding is 70–80° C.

In one embodiment, the solutions from a) and 1)) are fed into the centrifuge by being pumped (such as using a peristaltic or metering pump) through the inlet feed ports. The centrifuge can be any liquid/liquid centrifuge capable of performing the specified steps. In one embodiment, the liquid/liquid centrifuge used is a Cinc ™ Model V-2 liquid/liquid centrifuge (Available from CINC, Carson City, Nev.; web site: http://www.cinc-co.com). This liquid/liquid centrifuge uses centrifugal force to separate immiscible liquids of different densities. The unit is comprised of a metal housing and stand, with inlet and outlet ports, an observation window, a rotor (its only moving part), and a motor connected to the rotor via a flexible, direct coupling. An AC inverter drive controller provides for precise control of the rotor speed. The fluids are homogenized in an annular mixing zone, and then directed by bottom vanes towards a rotor inlet. For applications, where premixing is not beneficial, an inner sleeve can be installed which limits contact of the fluids with the rotating rotor (i.e. two different mixing heads corresponding to different shear forces are available for this unit). Centrifugal forces in the range of 100–400 g's can be generated by this centrifuge.

d) Rotating the Mixture in the Centrifuge

The fourth step of the present method involves rotating the mixture from step c) inside said liquid/liquid centrifuge at a rotational speed sufficient to separate the mixture from step c) into two separate phases, and thereafter collecting the two phases, each through a separate outlet port, into two separate containers, wherein the heavier phase (H) contains the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system and 3) the film-forming resin. It is understood that the aforementioned "aqueous solution of metal ions" includes both metal ions complexed to the metal ion chelating agent as well as uncomplexed metal ions.

In one embodiment, the amount of water in the heavier phase (H) comprises less than 10%, and in one embodiment, less than 5% water. In one embodiment, the lighter phase (L) comprises less than 5%, and in one embodiment, less than 3% of the water-immiscible solvent system and less than 5%, and in one embodiment, less than 2% of the film-forming resin.

In one embodiment, the mixture is rotated at a speed of at least 500 rpm (revolutions per minute), preferably from 500 to 50,000 rpm, most preferably from 1,000 to 30,000 rpm.

In one embodiment of the present invention, the solution of the film-forming resin solution and the washing solution can be recycled through the centrifuge, such that metal ions can be removed more effectively by a continuous or semi-continuous process. Thus, the present invention also provides, that in addition to steps a) through d), the process further comprises iteratively performing a cycle of steps (e) and (f) below:

(e) feeding the heavier phase (H) and the lighter phase (L) from step d) into the liquid/liquid centrifuge through the two separate inlet ports, one of said inlet port feeding the heavier phase (H), and the second inlet port feeding the lighter phase (L), at a feed rate ratio of the heavier phase (H) to the lighter phase (L) from 10/90 to 90/10, at a temperature of from 0° C. up to a maximum temperature that is less than the boiling point of the lowest boiling water-immiscible solvent in the water-immiscible solvent system;

(f) rotating the mixture from step e) inside said liquid/liquid centrifuge at a rotational speed sufficient to separate the mixture from step e) into two separate phases, each through a separate outlet port, into two separate containers, wherein the heavier phase (H) contains the film-forming resin in the water-immiscible solvent system, with a minor amount of water; and the lighter phase (L) comprises: 1) an aqueous solution of metal ions and a minor amount of a mixture of 2) the water-immiscible solvent system and 3) the film-forming resin.

As used herein, the phrase "iteratively performing a cycle of steps e) and f)" means the repetitive performance of a cycle comprising one-time performance of step e) followed by one-time performance of step f). Said cycle of steps e) and f) can be iteratively performed until the heavier phase (H) in step f) has a metal ion concentration that is substantially unchanged, i.e. further performance of said cycle does not lower the concentration of the metal ions in the film forming resin.

In one embodiment, the solution of the film-forming resin is recycled with fresh portions of the washing solution to continuously reduce the concentration of metal ions in the film-forming resin to the lowest possible levels. Thus, in one embodiment, the present invention provides a method for reducing the metal ion content of a film-forming resin, said method comprising the steps of:

a) providing a solution of the film-forming resin in a water-immiscible solvent system comprising at least one water-immiscible solvent;

b) providing a washing solution comprising water or a dilute solution of a water-soluble metal ion chelating agent;

c) feeding the solution from a) and a portion of the solution from b) through two separate inlet ports into a liquid/liquid centrifuge, one of said inlet ports feeding the solution from a), the second inlet port feeding the portion of the solution from b) into said liquid/liquid centrifuge at a feed rate ratio of the solution from a) to that of b) from 10/90 to 90/10, at a temperature of from 0° C. up to a maximum temperature that is less than the boiling point of the lowest boiling water-immiscible solvent in the water-immiscible solvent system;

d) rotating the mixture from step c) inside said liquid/liquid centrifuge at a rotational speed sufficient to separate the mixture from step c) into two separate phases, and then collecting the two separate phases, each through a separate outlet port, into two separate containers, wherein the heavier phase (H) contains the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system and 3) the film-forming resin; and further performing iteratively the steps e) and f) below in the following order: e) adding another portion of the solution from b) to the lighter phase (L) in step d) to form a new mixture of lighter phase (L), and feeding said new mixture of lighter phase (L) and the heavier phase (H) in step d) through the two separate inlet ports, one of said inlet ports feeding the heavier phase (H), the second inlet port feeding the new mixture of the lighter phase (L), into the liquid/liquid centrifuge at a feed rate ratio of the new mixture of lighter phase (L) to the heavier phase (H) from 10/90 to 90/10, at a temperature of from 0° C. up to a maximum temperature that is less than the boiling point of the lowest boiling water-immiscible solvent in the water-immiscible solvent system; and f) rotating the mixture from step d) inside said liquid/liquid centrifuge at a rotational speed sufficient to separate the mixture of step e) into two separate phases, and then collecting the two phases, each through a separate outlet port, into two separate containers, wherein the heavier phase (H) contains the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system and 3) the film-forming resin.

The instant invention illustrates that using a semicontinuous or continuous method for removing metal ions from film-forming resins by the use of a liquid/liquid centrifuge is a time saving means for preparing film-forming resins with lower metal ion content. Such resins are useful in formulating photoresist compositions.

Method for Producing a Photoresist Composition

The present invention also provides a method for producing a photoresist composition, said method comprising:

(a) providing a film-forming resin having a reduced metal ion content according to the aforementioned methods;

(b) providing an admixture comprising: 1) a photosensitive component in an amount sufficient to photosensitive a photoresist composition; 2) the film-forming resin in a); and optionally, 3) additional photoresist solvent; to form a photoresist composition.

The photosensitive component is well known to those of ordinary skill in the art. Suitable photosensitive compounds include o-quinone diazides, as demonstrated by "Light Sensitive Systems", Kosar, J.; John Wiley & Sons, New York, 1965 Chapter 7.4. Other examples of photosensitive compounds include photoacid generators such as onium salts, hydroxymaleimide triflates and diazonium sulfonates. The photoresist solvent can comprise any of those listed above as examples of water-immiscible solvents.

Optional Ingredients

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to a 4 percent weight level, based on the combined weight of novolak and sensitizer.

Development speed enhancers that may be used include, for example, picric acid, nicotinic acid or nitrocinnamic acid up to a 20 percent weight level, based on the combined weight of novolak and sensitizer. These erhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and subsequent drying. Non-ionic surfactants that may be used include, for example, nonylphenoxy poly(ethyleneoxy) ethanol; octylphenoxy ethanol at up to 10% weight levels, based on the combined weight of novolak and sensitizer.

Method for Producing a Microelectronic Device

The present invention also provides a method for producing a microelectronic device by forming an image on a substrate, said method comprising:

a) providing the aforementioned photoresist composition;

b) thereafter, coating a suitable substrate with the photoresist composition from step a);

c) thereafter, heat treating the coated substrate until substantially all of the water-immiscible solvent system is removed; image-wise exposing the coated substrate; and then removing the imagewise exposed areas of the coated substrate with a suitable developer.

Substrates suitable for the present invention include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist compositions produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane, preferably hexamethyl disilazane (HMDS).

The photoresist composition can be applied to the substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist composition is coated onto the substrate, and the coated substrate is heat treated until substantially all of the water-immiscible solvent is removed. In one embodiment, heat treatment of the coated substrate involves heating the coated substrate at a temperature from 70° C. to 110° C. for from 30 seconds to 180 seconds on a hot plate or for from 15 to 90 minutes in a convection oven. This temperature treatment is selected in order to reduce the concentration of residual solvents in the photoresist composition, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from 850° C. to 95° C. The treatment is conducted until the rate of change of solvent removal becomes relatively insignificant. The temperature and timed selection depends on the photoresist properties desired by the user, as well as the equipment used and commercially desired coating times.

The coated substrate can then be exposed to actinic radiation, e.g., ultraviolet radiation, at a wavelength of from 300 nm to 450 nm, x-ray, electron beam, ion beam or laser radiation, in any desired pattern, produced by use of suitable masks, negatives, stencils, templates, etc.

The substrate coated with the photoresist composition is then optionally subjected to a post exposure second baking or heat treatment, either before or after development. The heating temperatures may range from 90° C. to 120° C., more preferably from 100° C. to 110° C. The heating may be conducted for from 30 seconds to 2 minutes, more preferably from 60 seconds to 90 seconds on a hot plate or 30 to 45 minutes by convection oven.

The exposed photoresist-coated substrates are developed to remove the image-wise exposed areas (positive photoresists), or the unexposed areas (negative photoresists), by immersion in an alkaline developing solution or developed by a spray development process. The solution is preferably agitated, for example, by nitrogen burst agitation. The substrates are allowed to remain in the developer until all, or substantially all, of the photoresist coating has dissolved from the exposed or unexposed areas. Developers may include aqueous solutions of ammonium or alkali metal hydroxides. One preferred hydroxide is tetramethyl ammonium hydroxide. After removal of the coated wafers from the developing solution, one may conduct an optional post-developmnent heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching, solution. The photoresist compositions of the present invention are resistant to acid-base etching solutions and provide effective protection for the unexposed photoresist-coating areas of the substrate.

EXAMPLES

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and. percents are by weight, all temperatures are in degrees Centigrade, and all molecular weights are weight average molecular weight. The unit "ml/min" indicates is an abbreviated form for milliliters/minute.

Example 1

A novolak resin having a meta-cresol to para-cresol ratio of 55% to 45% was prepared as a 30% solids solution in propylene glycol mono-methyl ether acetate (PGMEA). This solution was used as one inlet feed stream and was pumped at a rate of 150 ml/min into the CINC® Model V-2 liquid/liquid centrifuge. Simultaneously, 75 ml/min of de-ionized water was pumped through the second inlet feed. Both solutions were equilibrated at 75–80° C., prior to pumping through the centrifuge. Samples of the resin solution outlet feed were taken before and after a 15-min recirculation of the resin solution through the centrifuge with fresh de-ionized water used throughout the test. Metal ion concentration measured by atomic absorption vs. control samples showed that the concentration of iron ions was reduced from about 677 parts per million (ppm) to about 171 ppm while the chromium ion concentration was reduced from about 303 ppm to about 27 ppm.

Example 2

A novolak resin having about 40.5% para-cresol, 46.2% meta-cresol, 6.8% 2,4-xylenol and about 5.6% 2,5 xylenol phenolic moieties and condensed with formaldehyde at a total substituted phenol/formaldehyde ratio of about 1/0.65 was used as a 40% solids resin solution in PGMEA as the resin inlet feed stream. The second feed stream was comprised of a 0.05% solution of the ammonium salt of ethylene diamine tetra-acetic acid (EDTA) in de-ioni2zed water. The ratio of the feed rate of the resin solution to that of the EDTA solution was 1:1 (each feed rate being 200 ml/min).

The resin stream was recirculated while fresh EDTA solution was continuously fed into the other port. Both solutions were maintained at 75–80° C. Samples were taken periodically over a 60 minute period and the metals ion concentrations were measured over time. In this experiment a low shear mixing head was used in the centrifuge. The use of this head minimizes shear forces between the two phases. Table 1 below shows the variation in the reduction in metal ion concentration of the novolak resin with wash times. In this and the Examples below, the metal ion concentration was determined by atomic absorption spectroscopy.

TABLE I

Metal Ion Concentration vs. Wash Time (Low Shear Mixing Head)

| Time (minutes) | Iron content (ppm) | Chromium content (ppm) |
| --- | --- | --- |
| 0 | 170 | 67 |
| 10 | 145 | 61 |
| 20 | 105 | 52 |
| 30 | 50 | 45 |
| 45 | 37 | 41 |
| 60 | 16 | 37 |

Example 3

The method of Example 2 was repeated, except that a high shear mixing head was used in place of the low shear head in Example 2. This high shear mixing head increases phase mixing (i.e., higher shear forces between the phases). In addition, a 40% solids solution of the same resin was used and the ratio of the feed rate of the resin solution to that of the 0.05% EDTA solution was changed to 4:1 (i.e., 200 ml/min. of the resin solution to 50 ml/min. of the EDTA solution. Table II below shows the reduction in metal ion concentration of the novolak resin after 20 minutes.

TABLE II

Metal Ion Concentration vs. Recirculation Time (High Shear Mixing Head)

| Time (minutes) | Iron content (ppm) | Chromium content (ppm) |
| --- | --- | --- |
| 0 | 170 | 67 |
| 20 | 16 | 28 |

Example 4

The method of Example 3 was repeated, except that 2. 30% solids solution of the same resin was used. The ratio of the feed rate of the resin solution to 0.05% EDTA solution feed rates was the same as in Example 3. Table III shows the reduction in metal ion metal ion concentration after 10 minutes.

TABLE III

Metal Ion Concentration vs. Recirculation Time (High Shear Mixing Head)

| Time (minutes) | Iron content (ppm) | Chromium content (ppm) |
| --- | --- | --- |
| 0 | 224 | 85 |
| 10 | 107 | 63 |

Example 5

A 40% solids solution of the resin of Example 1 in propylene glycol methyl ether acetate (PGMEA), a 5% solution of citric acid in deionized water and a 5% solution of EDTA diammonium salt in deionized water were prepared separately. The solutions were heated separately to 75° C. The resin solution was pumped into the centrifuge from a jacketed flask at 75° C., 200ml/minute. The citric acid solution was pumped into the centrifuge at 75° C., 50ml/min.

The heavier phase containing the resin solution was recirculated back into the feeding into the feeding flask and again into the centrifuge through the inlet port. The lighter phase was isolated and not recirculated with the feed for the citric acid solution. The resin solution was washed (i.e., recycled through the centrifuge) for 45 minutes using this 4:1 feed ratio of the resin solution to citric acid solution. The citric acid solution was then replaced with the EDTA as the washing solution and the resin was washed in the centrifuge for another 45 minutes. The EDTA diammonium salt solution was then replaced with deionized water as the washing solution and the resin was washed in the centrifuge for another 30 minutes.

Samples were removed periodically for measurement of metal ion concentration. The solvent from the final resin solution was removed by a rotary evaporator and solid content adjusted with addition PGMEA to 26% solids content for testing for dissolution rate and lithography. Dissolution rates (DR) are determined for resins to show relative removal in typical resist developers. Silicon wafers are coated with the resin and the dried coated wafer subjected to laser interferometric determination of coating thickne ss versus time.

DR measurement was conducted on a Xinix ™ Model 2200 Process Monitor. Silicon wafers, primed with hexamethyldisilizane (HMDS), were coated with 26% solids novolak resin solution at 110° C. for 60 seconds at a spin speed appropriate to give a coated film thickness of 1.60±0.1 micrometers, as measured on a Nano™ 215 device using the 5 point 4-inch wafers program. A wafer was attached to the Xinix™ probe and was immersed in a bath of AZ® 300 MIF developer, until the resin was removed. Two wafers were run and averaged to obtain the DR as measured in Angstroms/second (Å/sec.). The results showing the concentration of metal ions at various times are shown in Table IV below.

TABLE IV

Concentration of Metal Ions and Dissolution Rate after Resin wash under various Conditions

| Run # | Resin Washing Conditions | Na (ppm) | Fe (ppm) | Cr (ppm) | Dissolution Rate (Å/sec.) |
|---|---|---|---|---|---|
| 1 | 10 min with citric acid | 105 | 248 | 189 | 211 |
| 2 | 20 min with citric acid | 108 | 220 | 176 | — |
| 3 | 30 min with citric acid | 46 | 153 | 120 | — |
| 4 | 45 min with citric acid | 25 | 56 | 58 | — |
| 5 | 15 min with EDTA diammonium salt | 26 | 14 | 33 | — |
| 6 | 30 min with EDTA diammonium salt | 22 | 11 | 33 | — |

TABLE IV-continued

Concentration of Metal Ions and Dissolution Rate after Resin wash under various Conditions

| Run # | Resin Washing Conditions | Na (ppm) | Fe (ppm) | Cr (ppm) | Dissolution Rate (Å/sec.) |
|---|---|---|---|---|---|
| 7 | 45 min with EDTA diammonium salt | 24 | 20 | 36 | " |
| 8 | 30 min with deionized water | 14 | 24 | 40 | 215 |
| Total Time | 220 minutes | | | | |

As the results in Table IV indicate, the dissolution rate was constant (the rates being the same at run #1 and 8 within experimental error), indicating that no appreciable change in the resin (such as fractionation) occurred during the process of metal ion reduction/removal.

Each of the documents referred to above is incorporated herein by reference in its entirety, for all purposes. Except in the Examples, or where otherwise explicitly indicated, all numerical quantities; in this description specifying amounts of materials, reaction and process conditions (such as temperature, time, pressure), feed ratios, rotational sp,eeds of centrifuge, and the like are to be understood to be modified by the word "about".

What we desire to claim is:

1. A method for reducing the metal ion content of a film-forming resin, said method comprising the steps of:
   a) providing a solution of the film-forming resin in a water-immiscible solvent system comprising at least one water-immiscible solvent;
   b) providing a washing solution comprising water or a dilute solution of a water-soluble metal ion chelating agent;
   c) feeding the solutions from a) and b) through two separate inlet ports into a liquid/liquid centrifuge, one of said inlet ports feeding the solution from a), the second inlet port feeding the solution from b) into said liquid/liquid centrifuge at a feed rate ratio of the solution from a) to that from b) from about 10/90 to about 90/10, at a temperature of from about 0° C. up to a maximum temperature that is less than the boiling point of the lowest boiling water-immiscible solvent in the water-immiscible solvent system; and
   e) rotating the mixture from step c) inside said liquid/liquid centrifuge at a rotational speed sufficient to separate the mixture from step c) into two separate phases, and then collecting the two separate phases, each through a separate outlet port, into two separate containers, wherein the heavier phase (H) comprises the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system, and 3) the film-forming resin.

2. The method of claim 1 wherein the film forming resin is at least one member selected from the group consisting of novolak resins, polyhydroxystyrenes and derivatives thereof.

3. The method of claim 1 wherein the water-soluble metal ion chelating agent is at least one member selected from the group consisting of ethylene diamine tetra-acetic acid (EDTA), ammonium salt of EDTA, and citric acid.

4. The method of claim 1 wherein in step a), the water-immiscible solvent system comprises a monooxymonocarboxylic acid ester, a propylene glycol methyl ether acetate, 2-heptanone, a propylene glycol methyl ether, or a mixture of at least two thereof.

5. The method of claim 1 wherein in step c), the solutions from steps a) and b) are fed into the centrifuge at a temperature of from about 0° C. to about 10° C. less than the boiling point of the lowest boiling water-immiscible solvent in the water-immiscible solvent system.

6. The method of claim 1 wherein in step d), the mixture from step c) is rotated at a speed of from about 500 to about 50,000 rpm.

7. The method of claim 1, further comprising iteratively performing a cycle of steps e) and f) below in the following order:

e) feeding the heavier phase (H) and the lighter phase (L) from step d) into the liquid/liquid centrifuge through the two separate inlet ports, one of said inlet port feeding the heavier phase (H), and the second inlet port feeding the lighter phase (L), at a feed rate ratio of the heavier phase (H) to the lighter phase (L) from about 10/90 to about 90/10, at a temperature of from about 0° C. up to a maximum temperature that is less than the boiling point of the lowest boiling water-immiscible solvent in the water-immiscible solvent system;

f) rotating the mixture from step e) inside said liquid/liquid centrifuge at a rotational speed sufficient to separate the mixture from step e) into two separate phases, each through a separate outlet port, into two separate containers, wherein the heavier phase (H) contains the film-forming resin in the water-immiscible solvent system, with a minor amount of water; and the lighter phase (L) comprises: 1) an aqueous solution of metal ions and a minor amount of a mixture of 2) the water-immiscible solvent system and 3) the film-forming resin.

8. The method of claim 7 wherein the cycle of steps e) and f) are performed iteratively until the heavier phase (H) in step f) has a metal ion concentration that is substantially unchanged.

9. A method for reducing the metal ion content of a film-forming resin, said method comprising the steps of:

a) providing a solution of the film-forming resin in a water-immiscible solvent system comprising at least one water-immiscible solvent;

b) providing a washing solution comprising water or a dilute solution of a water-soluble metal ion chelating agent;

c) feeding the solution from a) and a portion of the solution from b) through two separate inlet ports into a liquid/liquid centrifuge, one of said inlet ports feeding the solution from a), the second inlet port feeding the portion of the solution from b) into said liquid/liquid centrifuge at a feed rate ratio of the solution from a) to that of b) from about 10/90 to about 90/10, at a temperature of from about 0° C. up to a maximum temperature that is less than the boiling point of the lowest boiling water-immiscible solvent in the water-immiscible solvent system;

d) rotating the mixture from step c) inside said liquid/liquid centrifuge at a rotational speed sufficient to separate the mixture from step c) into two separate phases, and then collecting the two separate phases, each through a separate outlet port, into two separate containers, wherein the heavier phase (H) contains the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system and 3) the film-forming resin; and further performing iteratively a cycle of steps e) and f) below in the following order:

e) adding another portion of the solution from b) to the lighter phase (L) in step d) to form a new mixture of lighter phase (L), and feeding said new mixture of lighter phase (L) and the heavier phase (H) in step d) through the two separate inlet ports, one of said inlet ports feeding the heavier phase (H), the second inlet port feeding the new mixture of the lighter phase (L), into the liquid/liquid centrifuge at a feed rate ratio of the new mixture of lighter phase (L) to the heavier phase (H) from about 10/90 to about 90/10, at a temperature of from about 0° C. up to a maximum temperature that is less than the boiling point of the lowest boiling water-immiscible solvent in the water-immiscible solvent system; and f) rotating the mixture from step d) inside said liquid/liquid centrifuge at a rotational speed sufficient to separate the mixture of step e) into two separate phases, and then collecting the two phases, each through a separate outlet port, into two separate containers, wherein the heavier phase (H) contains the film-forming resin having a reduced metal ion content in the water-immiscible solvent system, with a minor amount of water; and the lighter phase (L) comprises: 1) an aqueous solution of metal ions and a minor amount of a mixture of 2) the water-immiscible solvent system and 3) the film-forming resin.

10. The method of claim 11 wherein the cycle of steps e) and f) are performed iteratively until the metal ion concentration in the heavier phase (H) in step f) is substantially unchanged.

11. A method for producing a photoresist composition, said method comprising:

b) providing a film-forming resin having a reduced metal ion content according to the method of claim 1, 7, 8, 9, or 10;

c) providing an admixture of: 1) a photosensitive component in an amount sufficient to photosensitive a photoresist composition; 2) the film-forming resin in a); and optionally, 3) an additional photoresist solvent; to form a photoresist composition.

12. A method for producing a semiconductor device by forming an image on a substrate, said method comprising:

a) providing the photoresist composition of claim 11;

b) thereafter, coating a suitable substrate with the photoresist composition from step a);

c) thereafter, heat treating the coated substrate until substantially all of the water-immiscible solvent system is removed; image-wise exposing the coated substrate; and then removing the imagewise exposed or, alternatively, the unexposed areas of the coated substrate with a suitable developer.

* * * * *